United States Patent [19]

Choinski

[11] Patent Number: 4,700,474

[45] Date of Patent: Oct. 20, 1987

[54] APPARATUS AND METHOD FOR TEMPORARILY SEALING HOLES IN PRINTED CIRCUIT BOARDS

[75] Inventor: Edward J. Choinski, Wayland, Mass.

[73] Assignee: MultiTek Corporation, Wayland, Mass.

[21] Appl. No.: 935,255

[22] Filed: Nov. 26, 1986

[51] Int. Cl.[4] .......................... H05K 3/10; B32B 31/00
[52] U.S. Cl. ...................................... 29/846; 156/247; 156/382; 219/243
[58] Field of Search .................. 29/846; 156/286, 247, 156/382, 344, 583.1; 219/243; 427/97

[56] References Cited

U.S. PATENT DOCUMENTS

| | | | |
|---|---|---|---|
| 3,198,681 | 8/1965 | Watts, Jr. .......................... | 156/382 X |
| 3,330,712 | 7/1967 | Rowe ................................ | 156/247 X |
| 3,888,719 | 6/1975 | Gibbs et al. ...................... | 219/243 X |
| 4,234,373 | 11/1980 | Reavill et al. ..................... | 156/382 |
| 4,421,589 | 12/1983 | Armini et al. ................. | 156/583.1 X |
| 4,647,327 | 3/1987 | Rase ................................. | 156/382 X |

FOREIGN PATENT DOCUMENTS

| | | | |
|---|---|---|---|
| 3027336 | 2/1982 | Fed. Rep. of Germany ........ | 427/97 |
| 224631 | 12/1968 | U.S.S.R. .............................. | 427/97 |

Primary Examiner—Howard N. Goldberg
Assistant Examiner—Carl J. Arbes
Attorney, Agent, or Firm—Richard J. Birch

[57] ABSTRACT

An apparatus and method for temporarily sealing holes in printed circuit boards are disclosed. The apparatus comprises two major assemblies: a heater block assembly and a vacuum table assembly. The heater block assembly employs a temperature controlled, insulated heater block having a surrounding, movable vacuum collar. A flexible thermally conductive vacuum skin is mounted on the movable vacuum collar and forms a vacuum chamber in cooperation with a movable vacuum table having a flat, porous plate whose upper surface is parallel to the vacuum table surface. A sandwich comprising a porous release sheet, the printed circuit board, a thermodeformable material and a thermally conductive cover sheet is positioned on the vacuum table flat, porous plate. Thereafter, the vacuum table and sandwich are moved together so that the table forms a sealing relation with the flexible, thermally conductive vacuum skin. A vacuum is then drawn in the now formed vacuum chamber forcing the flexible, thermally conductive vacuum skin against the sandwich to compress the porous release sheet between the printed circuit board and the flat, porous plate. At this point, the flexible, thermally conductive vacuum skin, sandwich and vacuum table are moved into a position in which the flexible, thermally conductive vacuum skin is formed into thermally conductive contact with the heater block. Heat from the heater block softens the thermodeformable material so that it deforms into the holes of the printed circuit board forming protectively sealing plugs therein. After cooling, the vacuum table is moved in the reverse direction to permit removal of the sandwich.

8 Claims, 9 Drawing Figures

APPARATUS AND METHOD FOR TEMPORARILY SEALING HOLES IN PRINTED CIRCUIT BOARDS

CROSS REFERENCE TO RELATED APPLICATION

The present application is related to applicant's co-pending application filed simultaneously herewith as Ser. No. 935,256 on Nov. 26, 1986 for "Method For Temporarily Sealing Holes In Printed Circuit Boards" and is incorporated herein by reference.

BACKGROUND OF THE INVENTION

The present invention relates to the manufacture of printed circuit boards and more particularly to an apparatus and method for temporarily sealing holes in the printed circuit board laminate during processing.

In the manufacture of printed circuit boards, a photoresist is used to transfer the outline of the circuit into the copper surface of the board. The name photoresist defines the dual functioning nature of this material. First it is a photo polymer whose chemical properties are changed by exposure to ultraviolet radiation. That exposure is done selectively through a mask outlining the circuit being defined. The dual functioning comes into play after developing the photo-polymer, where the soft unwanted areas are washed off the copper surface. What remains is a protective covering of hardened polymer only in those areas outlined by the exposure mask. In one application this protective covering resists the etching process so that only the copper left unprotected is etched away. When the resist is finally removed, the protected copper circuit lines underneath become the electrical conductors of the circuit board.

One real measure of the evolution of printed circuit board technology is the width of the copper circuit lines and the spacing between them. As the component density and circuits per square inch increase, the width of the circuit lines and the spaces between them must decrease. The current state of the art is 10 mil lines with 10 mil spaces. This geometry is ultimately determined by the process technology that allows the reliable fabrication of circuit boards within tolerances acceptable to the industry. In normal production a 10 mil wide circuit line can be controlled to within plus or minus 1 mil. If this line is spaced 10 mils from an adjacent line that may also vary by only 1 mil, there is little chance of having broken lines or short circuiting between lines. If, however, that line spacing geometry is reduced to 1 mil lines and spaces, the previous tolerance is unacceptable and the process technology must be advanced to achieve and maintain a tighter tolerance.

The most reliable and efficient method for connecting circuits on opposite sides of a circuit board is the use of the plated through hole. Before the circuit pattern is etched into the copper surfaces of the circuit board, the necessary interconnecting points between the two sides are first located and a hole drilled through the board at that position. In a complex circuit, there may be hundreds of holes each with its own specification and tolerances, making the precision, quality and cleanliness of each drill hole critical. Generally, after the circuit pattern has been defined, a copper conductor is plated inside along the wall of each hole connecting the copper circuits on one side to the other. To provide a good plated connection this hole must be clean and free of any photoresist or other contaminant. The plated connection must be almost perfect because each hole diameter is reduced by the thickness of the copper plating. The remaining hole must be large enough for the leads of the circuit board's components to be inserted into it but not too large to be filled with solder for a final connection.

Two methods are commonly used for applying photoresist to the copper surface of a circuit board. One of these is coating and the other is lamination. In coating, a fluid containing the photopolymer dissolved in solvent is applied to the copper surface in a thin uniform layer. The solvent is evaporated away and a uniform film of photoresist is deposited onto the copper surface. In lamination a previously coated and dried film of photoresist on a carrier web is bonded to the copper surface using heat and pressure, after which the carrier web is stripped away.

Most of the circuit boards produced today use the dry film method primarily for these two reasons. First there is no solvent fluid to cause safety, personnel, environmental or disposal problems. Secondly, there is no liquid photoresist to get inside the drill through holes to contaminate them and jeopardize the integrity of the plated through connections. These two advantages of dry film over coating are substantial but they are obtained at a price. One price is economic as dry film is about three times as costly per square foot as a coated photoresist. The other price, far more costly, is technological. Dry film has not been able to be produced reliably below a thickness of one mil. In order to reduce the line spacing geometry so that circuit density can be significantly increased, it is necessary to reduce the thickness of the photoresist to around 0.1 to 0.2 mils. A reliable well adhered photoresist can only be applied in that thickness range by using liquid coating technology. Handling the solvents associated with liquid photoresists has already been solved, however, before any liquid coating technology can be reliably used, the holes in the circuit board laminate must be temporarily sealed.

There are three major problems to be overcome in the temporary sealing of the holes in printed circuit board laminates before they are coated with photoresist. First, the sealing material must prevent any significant amount of photoresist from entering the hole. Secondly, the sealing material must be chemically inert, mechanically rugged and adhered strongly enough to maintain its sealing function during the subsequent processing steps. Finally and most importantly, the sealant material must be completely removed from every hole without leaving any contamination or residue on the hole wall.

Various methods for temporarily sealing the holes have been proposed. Early work described in U.S. Pat. No. 2,965,952 related to filling the holes with an inert material such as a protein substance. As pointed out in this patent, the process of filling and later cleansing of the plated holes was very time consuming and required a plating process in order to insure that the filling material would reside only in the holes and not on the surfaces of the plate. U.S. Pat. No. 2,965,952 attempts to solve the filling and cleansing problem by employing decalcomanias as a resist to the action of the etching solution. The decalomanias comprised a plurality of adhesive-backed strips that extended over the holes in the printed circuit board. This procedure required accurate registration of the protective strips and was also time consuming. U.S. Pat. No. 3,725,215 described a filler masking of small apertures in the printed circuit boards. The process utilized a photo-hardenable material that was placed in the holes with a backing sheet to prevent the material from falling through. After filling the holes, the photo-hardenable material was exposed to radiant energy to solidify it. Again, this process was time consuming and required care that the photo-hardenable material did not extend beyond the perimeter holes themselves.

It is accordingly a general object of the present invention to provide an improved method and apparatus for temporarily sealing holes in printed circuit board laminates.

It is a specific object of the invention to provide an apparatus which utilizes a thermodeformable sheet material that can be deformed into the holes of the printed circuit board under heat and pressure to form protective sealing plugs therein that can be easily removed from the printed circuit board after conventional processing of the board.

It is a further object of the invention to provide a cost effective apparatus and process for temporarily sealing printed circuit board holes in which the sealing material can be re-used a number of times.

It is a feature of the invention that the apparatus can be fabricated from commercial, readily available components.

BRIEF DESCRIPTION OF THE INVENTION

The method of the present invention solves the three hole filling problems described above by using a thermodeformable deformable sheet material that is deformed under heat and pressure to form protectively sealing plugs in each of the holes of the printed circuit board.

Deformation of the thermodeformable sheet material is performed in the apparatus of the present invention. The apparatus comprises two major assemblies: a heater block assembly and a vacuum table assembly. The heater block assembly employs a temperature controlled, insulated heater block having a surrounding, movable vacuum collar. A flexible, thermally conductive vacuum skin is mounted on the movable vacuum collar and forms a vacuum chamber in cooperation with a movable vacuum table having a flat, porous plate whose upper surface is parallel to the vacuum table surface. A sandwich comprising a porous release sheet, the printed circuit board, the thermodeformable sheet material and a thermally conductive cover sheet is positioned on the vacuum table porous plate. Thereafter, the vacuum table and sandwich are moved together so that the table forms a sealing relation with the flexible, thermally conductive vacuum skin. A vacuum is then drawn in the now formed vacuum chamber forcing the flexible, thermally conductive vacuum skin against the sandwich to compress the porous release sheet between the printed circuit board and the flat, porous plate. At this point, the flexible, thermally conductive vacuum skin, sandwich and vacuum table are moved into a position in which the flexible, thermally conductive vacuum skin is forced into thermally conductive contact with the heater block. Heat from the heater block softens the thermodeformable sheet material so that it deforms into the holes of the printed circuit board forming protectively sealing plugs therein. After cooling, the vacuum table is moved in the reverse direction to permit removal of the sandwich. The porous release sheet and cover sheet are then separated from the printed circuit board and its protective, now deformed, thermodeformable sheet material. Conventional processing of the PCB can be performed after which the deformed thermodeformable. sheet material is separated from the processed PCB for scrapping or re-use if desired.

The above described objects and features of the present invention and other objects will best be understood from a detailed description of a preferred embodiment of the invention, selected for purposes of illustration and shown in the accompany drawings in which.

Figure 2:
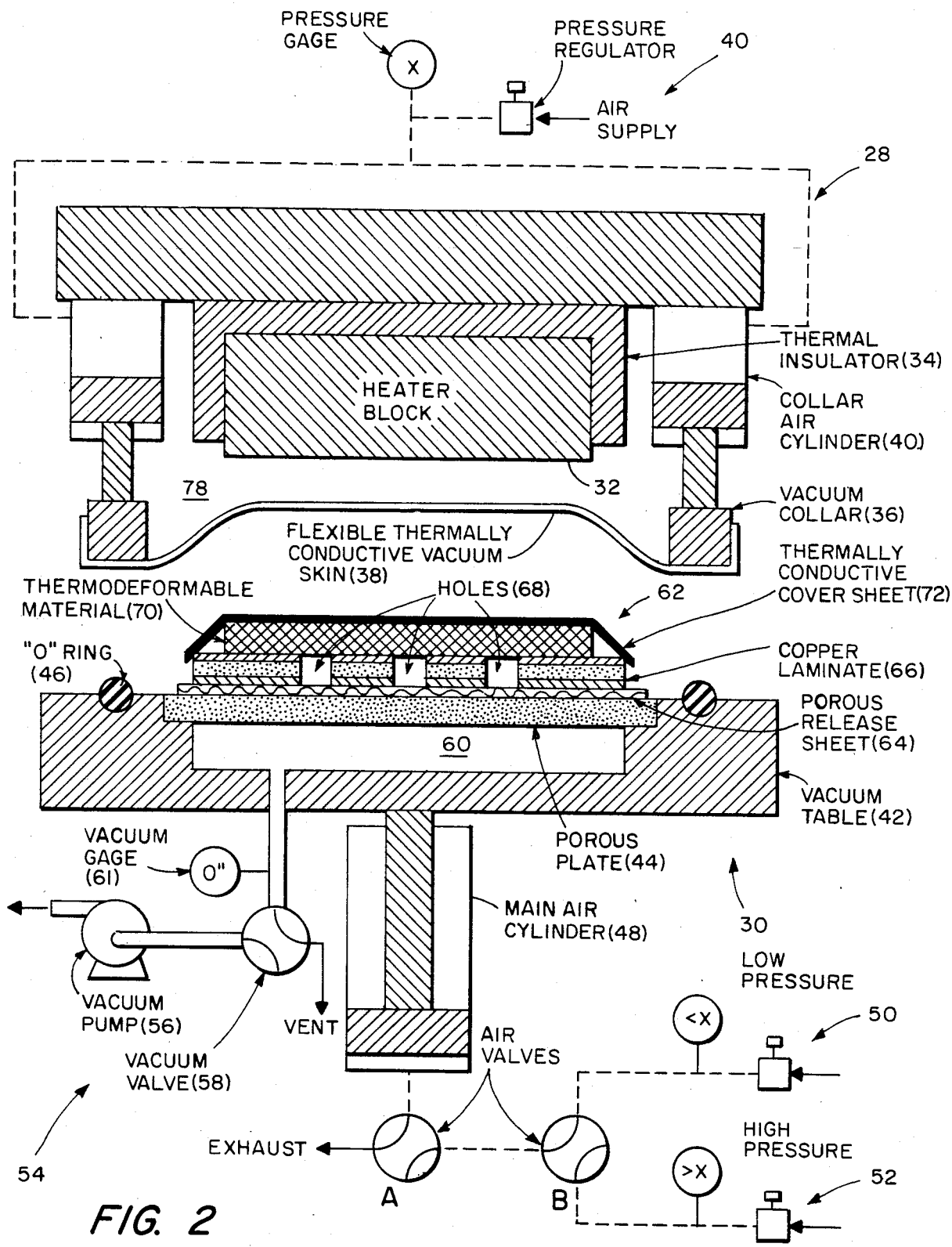
FIG. 2 illustrates diagramatically and in partial cross-section the apparatus of the present invention comprising a heater block assembly and a vacuum table assembly, a sandwich comprising a porous release sheet, a printed circuit board having holes therein, a thermodeformable sheet material and a thermally conductive cover sheet in position on the flat, porous plate of a movable vacuum table.
Figure 4:
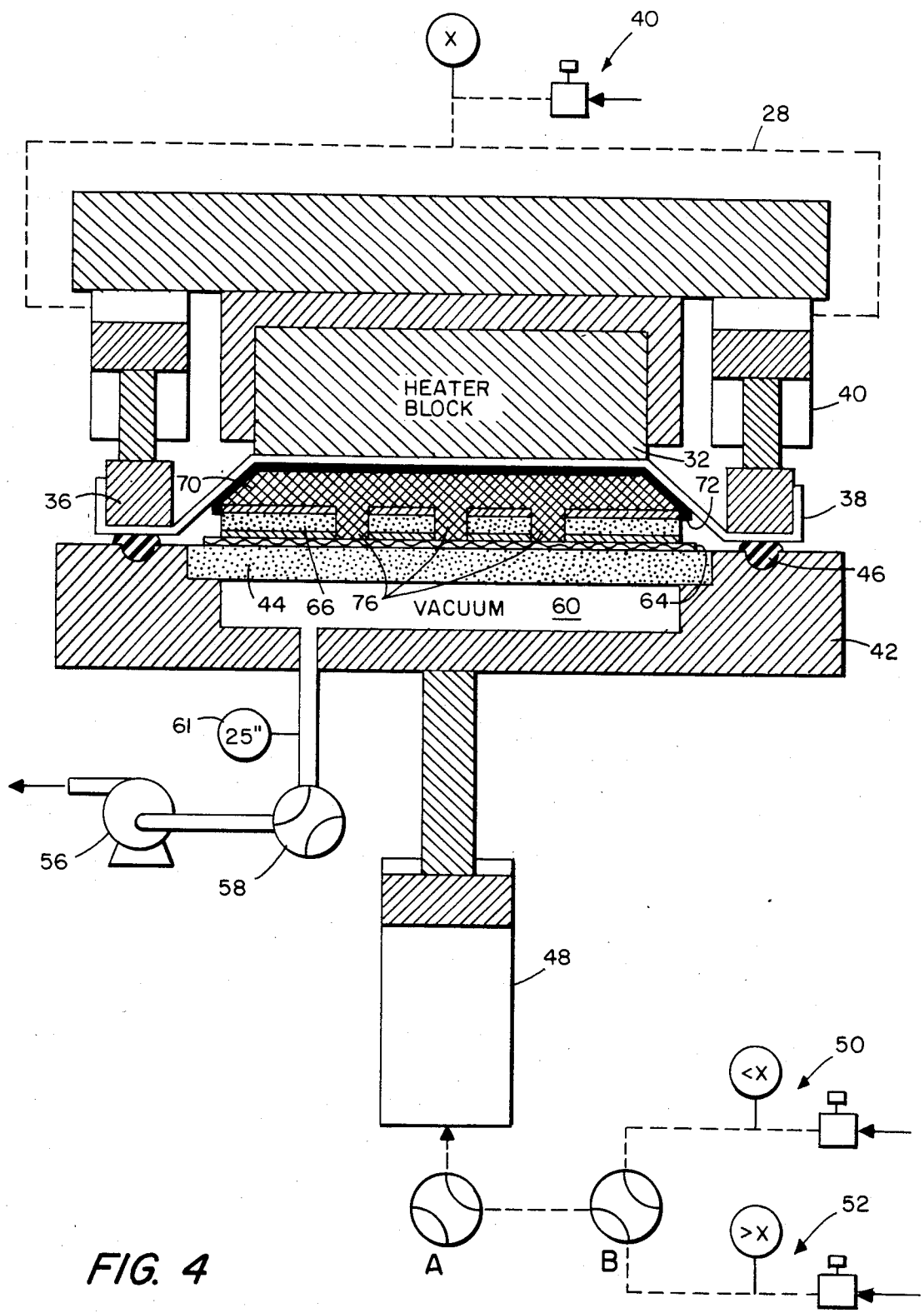
Figure 5:
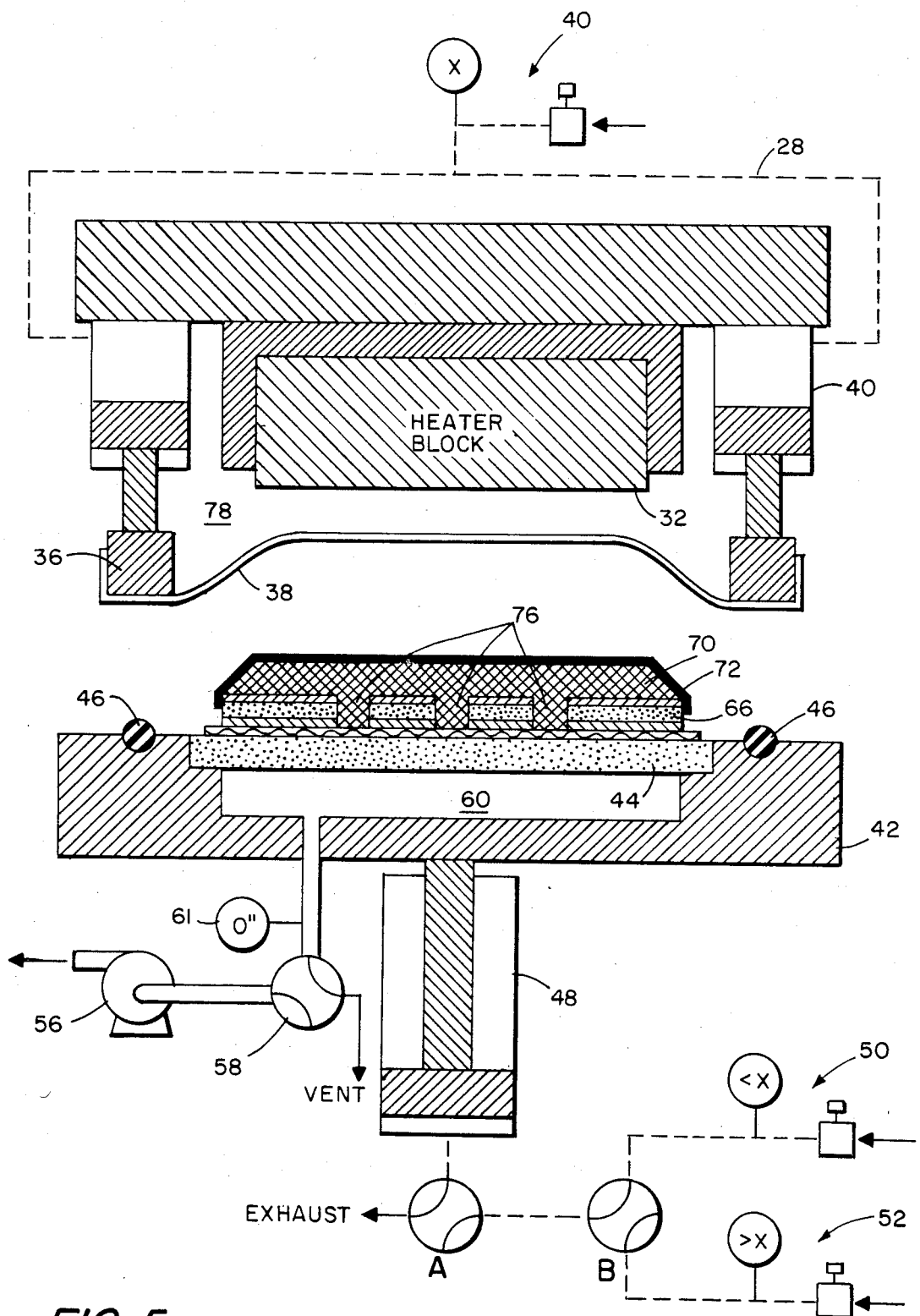

FIG. 4 shows the same components of FIG. 2 with the vacuum table moved into a position in which the flexible, thermally conductive vacuum skin is forced into thermally conductive contact with the heater block so that heat therefrom can soften the thermodeformable sheet material so that it deforms into the holes of the PCB to form protectively sealing plugs therein; and, FIG. 5 shows the vacuum table retracted from the heater block to permit removal of the PCB sandwich.

DETAILED DESCRIPTION OF THE INVENTION

Figure 1A:
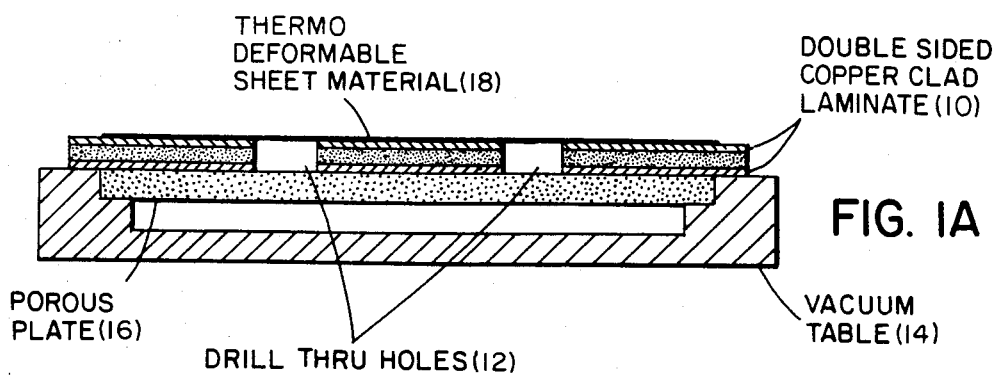
FIGS. 1A through 1E illustrate in a generalized form the steps employed in the method of the present invention to temporarily seal holes in a printed circuit board laminate.
Figure 1B:
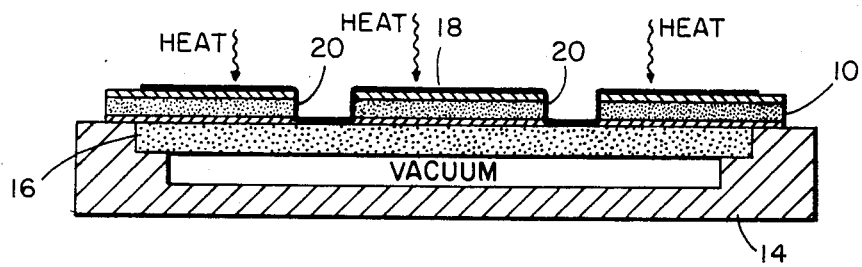

Turning now to the Figures, and specifically FIGS. 1A through 1E, there is shown in generalized form the steps employed in practicing the method of the present invention. A double-sided, copper clad laminate printed circuit board 10 having a plurality of drill through holes 12 is placed on a vacuum table 14 having a flat, porous plate 16. A thermodeformable sheet material 18 is placed in contact with the upper surface as viewed in of the printed circuit board 10. Heat is applied to the thermodeformable sheet material and a vacuum is drawn through the flat, porous plate 16 to deform the sheet material under heat and the vacuum force down into the drill through holes 12 to form protectively sealing plugs 20 therein. as shown in FIG. 1B.

Figure 1C:
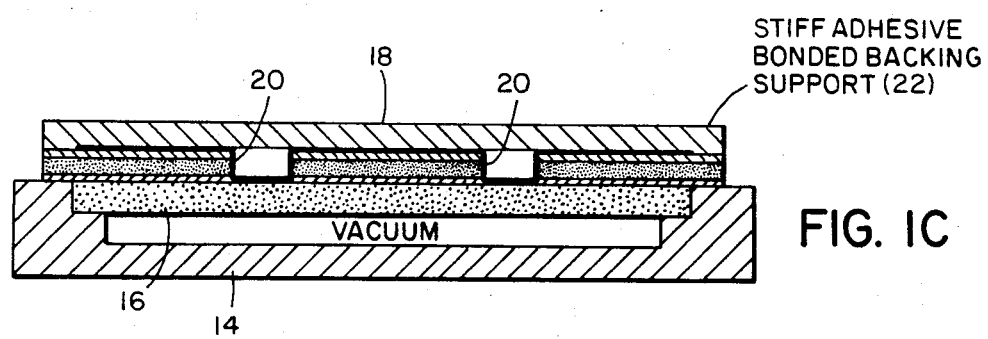
Figure 1D:
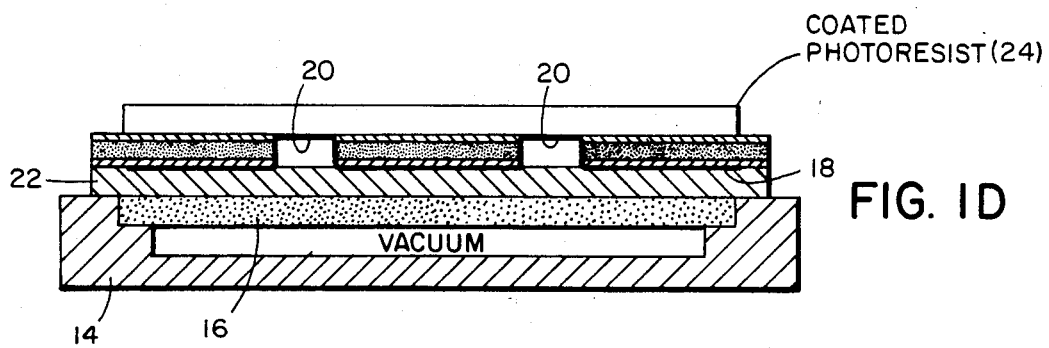
Figure 1E:
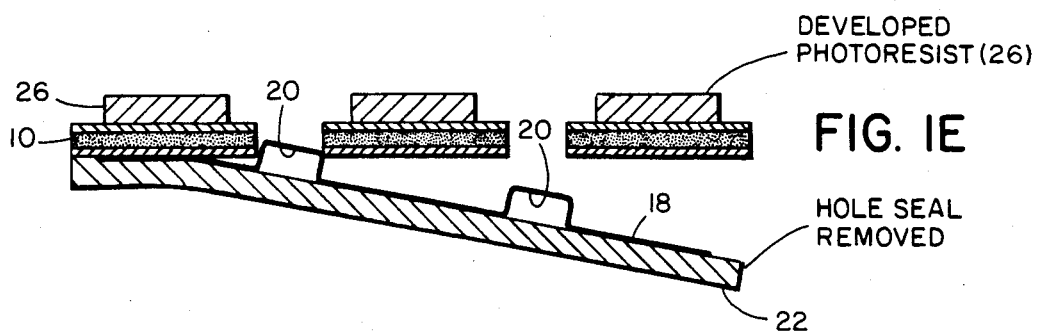

If desired, a relatively stiff, adhesive bonded backing support 22 can be affixed to the deformed sheet material 18 as shown in FIG. 1C. The protectively sealed printed circuit board laminate is turned upside down to expose the side of the printed circuit board laminate that was in contact with the flat, porous plate 16 as shown in FIG. 1D. This side of the printed circuit board is coated with a conventional photoresist 24. After exposure and development of photoresist 24, the deformed sheet material 20 and its support backing 22 are removed from the printed circuit board which now contains developed photoresist 26.

Turning now to FIG. 2, there is shown diagramatically and in partial section the apparatus of the present invention used to practice the method thereof. The hole sealing apparatus comprises two major assemblies: a heater block assembly indicated generally by the reference numeral 28 and a vacuum table assembly indicated generally by the reference numeral 30.

The heater block assembly 28 comprises a temperature controlled heater block 32 which is insulated by a thermal insulator 34. The insulated heater block 32 is surrounded by a movable vacuum collar 36 having a flexible, thermally conductive vacuum skin 38, such as, extra heavy duty aluminum foil, secured thereto and covering the heater block 32. The material selected for the vacuum skin 38 preferably should be relatively inexpensive and easily replaceable. Aluminum foil meets these criteria.

The vacuum collar 36 is mounted on collar air cylinders 40 which move the vacuum collar and the covering flexible thermally conductive vacuum skin 38 to an extended position as shown in FIG. 2. The extended position of the vacuum collar is achieved when a predetermined pressure of X psi is supplied to the collar air cylinders from a regulated pressure source indicated generally by the reference numeral 40.

The vacuum table assembly 30 is located directly beneath the heater block assembly 28 and is movable with respect thereto. The vacuum table assembly comprises a vacuum table 42 having a flat porous plate 44 mounted thereon so that the upper surface of the porous plate is parallel to the surface of the vacuum table, an "O"-ring 46 surrounds the porous plate and is positioned directly below the vacuum collar 36 of the heater block assembly. Movement of the vacuum table 42 in the vertical direction, as shown in FIG. 2, is controlled by a main air cylinder 48 that is selectively coupled through valves A and B to a low pressure source indicated generally by the reference numeral 50 and a high pressure source indicated generally by the reference numeral 52.

A vacuum source indicated generally by the reference numeral 54 and comprising a vacuum pump 56 and vacuum valve 58 is connected to chamber 60 of the vacuum table. The vacuum pump is capable of maintaining at least 25" Hg vacuum within chamber 60.

A sandwich indicated generally by the reference numeral 62 comprising a porous release sheet 64, a printed circuit board laminate 66 having holes 68 therein, a thermodeformable sheet material 70 and a thermally conductive cover sheet 72 is positioned on the porous plate of the vacuum table.

FIG. 2 illustrates the loading position of the vacuum table with valve A positioned to exhaust the pressure from the main air cylinder 48 thereby lowering the vacuum table away from the heater block assembly 28.

Figure 3:
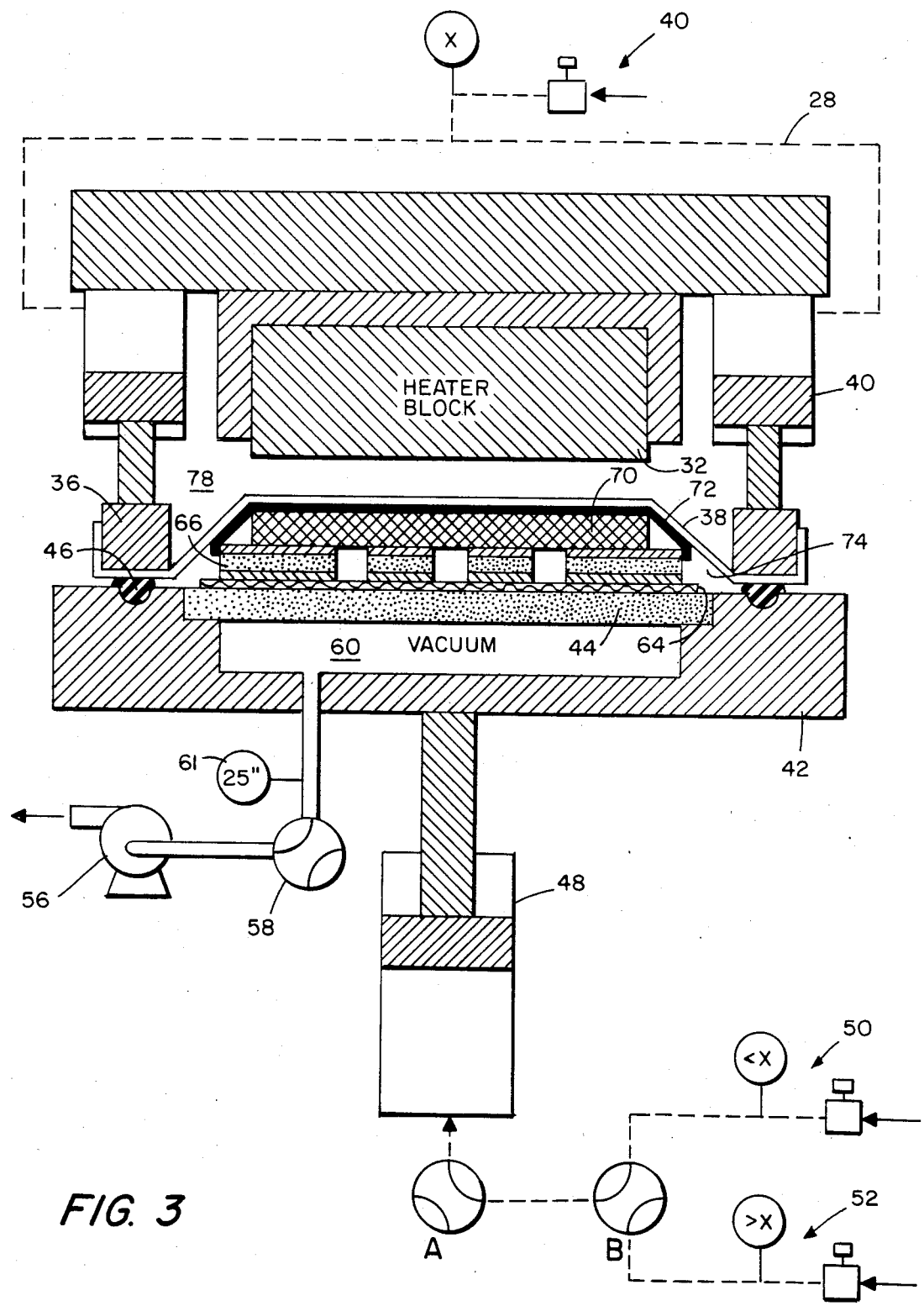
FIG. 3 illustrates the same components of FIG. 2 with the vacuum table moved into sealing contact with a flexible, thermally conductive vacuum skin that together with the vacuum table forms a vacuum chamber within which is positioned the PCB sandwich.

The sequence of operation once the sandwich 62 has been loaded in shown in FIGS. 3 through 5. Referring to FIG. 3, valve B is positioned to connect the low-pressure source (less than X psi) through valve A which is turned to send it to the main air cylinder 48. The low pressure applied to the main air cylinder 48 raises the vacuum table upwardly as viewed in FIG. 3 until the "O"-ring 46 comes in contact with the flexible, thermally conductive vacuum skin 38 covering vacuum collar 36. Upwardly movement is continued slightly to compress the "O"-ring as shown in FIG. 3 thereby creating a vacuum seal between the vacuum skin 38 and the vacuum table. The vacuum skin 38 and vacuum table 42 together form a vacuum chamber 74.

The low pressure air (less than X psi), is set so that it compresses the "O"-ring against the vacuum skin 38, but cannot overcome the air pressure (X psi) applied to the air collar cylinders 40.

When the vacuum valve 58 is turned from the vent position, as shown in FIG. 2, to the vacuum position, as shown in FIG. 3, the vacuum pump 56 removes the air from beneath the flexible skin 38 until a vacuum of 25" Hg is established as indicated on a vacuum gauge 61. The vacuum causes the flexible vacuum skin 38 to conform around the sandwich 62 forcing the layered components of the sandwich against the flat, porous plate 44 of the vacuum table.

When sufficient vacuum has been established, valve B is turned so that the high pressure air source 52 (greater than X psi) is connected to the main air cylinder 48 as shown in FIG. 4. The high pressure air allows the main air cylinder to overcome the pressure in collar air cylinders 40 so that the collar is forced upwardly as viewed in FIG. 4 allowing the heater block 32 to forcibly contact the flexible, thermally conductive vacuum skin 38. Heat is transmitted from the heater block through the flexible, thermally conductive vacuum skin and thermally conductive cover sheet 72 to the thermodeformable material 70. The vacuum and air cylinder forces pushing the flexible vacuum skin and thermally conductive cover sheet against the softened thermodeformable material force the material down into the laminate's holes 68 and up against the release sheet 64 thereby forming a protectively sealing plug 76 in each of the PCB's holes.

When sufficient time has elapsed, valve B is turned to the low pressure air source 50 (less than X psi) to connect the low pressure source to the main cylinder. This allows the pressure in the collar air cylinders 40 to force the main air cylinder down, moving the flexible, thermally conductive vacuum skin 38 away from and out of contact with the heater block 32 as shown in FIG. 3. When the sandwich beneath the vacuum skin has cooled sufficiently, the vacuum valve 58 is moved back to the vent position as shown in FIG. 5 and valve A is turned to the exhaust position, as shown in FIG. 5, to exhaust the air from the main cylinder. With the vacuum valve in the vent position and valve A in the exhaust position, the vacuum table drops back down to the loading position where the sealed sandwich can be removed. The process in then repeated to seal another copper clad circuit board.

If the sandwich 62 has a non-uniform thickness as the result of non-planarity of the printed circuit board laminate, variations in the thickness of the thermodeformable sheet material, etc., contact between the heater block and the flexible, thermally conductive vacuum skin (and therefor the sandwich) will not be uniform. The non-uniform contact can produce relatively "hot" or "cold" spots with respect to the heat transferred to the sandwich through the flexible, thermally conductive vacuum skin. The heat variations can be eliminated by providing a liquid heat transfer medium, such as oil, in at least a portion of the chamber 78 formed by collar 36, vacuum skin 38, air cylinders 40 and the heater block 32.

Having described in detail a preferred embodiment of my invention, it will be apparent to those skilled in the art that various modifications can be made therein without departing from the scope of the invention as described in the appending claims:

What I claim is:

1. A method for temporarily sealing holes in a printed circuit board laminate, said method comprising the steps of:
   A. forming a sandwich comprising:
      (i) a first component having a melting point, said first component comprising a flexible, thermally conductive sheet material;
      (ii) a second component having a melting point that is lower than the melting point of said first component, said second component comprising a sheet of thermodeformable material;
      (iii) a printed circuit board laminate having holes therein, said printed circuit board being positioned with the second component sheet of thermodeformable material in contact with one side of the printed circuit board laminate and covering at least some of said holes; and,
      (iv) a compressible porous release sheet positioned in contact with the other side of the printed circuit board laminate;
   B. placing said sandwich in a thermo-vacuum apparatus comprising:
      (1) a heater block assembly comprising:
         (a) a temperature controlled, insulated heater block means;
         (b) a vacuum collar means surrounding said heater block means;
         (c) a flexible, thermally conductive vacuum skin means secured to said vacuum collar means;
         (d) fluid actuated cylinder means connected to said vacuum collar means for moving said collar means and said flexible, thermally conductive vacuum skin means between an extended position and a retracted position with movement to said extended position being in response to the application of fluid at a pressure X to said fluid actuated cylinder means with said extended position locating the flexible, thermally conductive vacuum skin in spaced relation with respect to said heater block means;
      (2) a vacuum table assembly comprising:
         (a) vacuum table means;
         (b) a flat, porous plate means mounted on said vacuum table means so that the upper side of the porous plate means is parallel with the surface of the vacuum table means;
         (c) vacuum sealing means located on said vacuum table means for establishing a vacuum sealing relation with the flexible, thermally conductive vacuum skin means of said heater block assembly;
         (d) fluid actuated main cylinder means connected to said vacuum table means for moving said vacuum table means from a retracted position to an intermediate vacuum sealing position and then to a contact position and vice versa,
            said fluid actuated main cylinder means moving said vacuum table means to said intermediate sealing position in response to the application of a fluid at a pressure less than X to said fluid actuated main cylinder means at which position said sealing relation is established between the vacuum sealing means and the flexible, thermally conductive vacuum skin of the heater block assembly and, said fluid actuated main cylinder means moving said vacuum table means from said intermediate sealing position to said contact position in response to the application of a fluid at a pressure greater than X to said fluid actuated main cylinder means at which position said flexible, thermally conductive vacuum skin is forced into thermally conductive contact with said heater block means;
         (3) fluid pressure source means for applying fluid pressure at a pressure X to said heater block assembly fluid actuated cylinder means;
         (4) fluid pressure source means for sequentially applying fluid pressure at a pressure less than X and then at a pressure greater than X to said vacuum table assembly fluid actuated main cylinder means said fluid pressure source means including means for releasing the fluid pressure applied to said vacuum table assembly fluid actuated main cylinder means; and,
         (5) means for selectively applying and releasing a vacuum to said vacuum table means.
   C. applying fluid pressure at a pressure X to said heater block assembly fluid actuated cylinder means;
   D. applying fluid pressure at a pressure less than X to the vacuum table assembly fluid actuated main cylinder means so that the vacuum sealing means establishes said vacuum sealing relation with the flexible, thermally conductive vacuum skin means of the heater block assembly whereby a vacuum chamber is formed within which is located said sandwich;
   E. drawing a vacuum in said vacuum chamber so that the flexible, thermally conductive vacuum skin conforms around the sandwich whereby the layered components of the sandwich are forced against the flat, porous plate means;
   F. applying fluid pressure at a pressure greater than X to the vacuum table assembly fluid actuated main cylinder means whereby the heater block means forcibly contacts the flexible, thermally conductive vacuum skin;
   G. transferring heat from said heater block means to the thermally deformable sheet material until the sheet material has deformed into and filled the holes of the printed circuit board laminate;
   H. reducing the fluid pressure applied to the vacuum table assembly main cylinder means to a pressure less than X so that the vacuum table means returns to said intermediate position to permit cooling of the sandwich;
   I. releasing the vacuum in said vacuum chamber and removing the fluid pressure applied to said vacuum table assembly fluid actuated main cylinder means to allow the vacuum table means to return to its retracted position; and,
   J. removing the sandwich from the vacuum table.
2. A thermo-vacuum apparatus comprising:
   A. a heater block assembly comprising:
      (1) a temperature controlled, insulated heater block means;
      (2) a vacuum collar means surrounding said heater block means;
      (3) a flexible, thermally conductive vacuum skin means secured to said vacuum collar means;
      (4) means connected to said vacuum collar means for moving said collar means and said flexible, thermally conductive vacuum skin means between an extended position and a retracted position with said extended position locating the flexible, thermally conductive vacuum skin in spaced relation with respect to said heater block means;

B. a vacuum table assembly comprising:
(1) vacuum table means;
(2) a porous plate means mounted on said vacuum table means so that the upper side of the porous plate means is parallel with the surface of the vacuum table means;
(3) vacuum sealing means located on said vacuum table means for establishing a vacuum sealing relation with the flexible, thermally conductive vacuum skin means of said heater block assembly;
(4) means connected to said vacuum table means for moving said vacuum table means from a retracted position to an intermediate vacuum sealing position and then to a contact position and vice versa, with said sealing relation being established between the vacuum sealing means and the flexible, thermally conductive vacuum skin of the heater block assembly at said intermediate vacuum sealing position and said flexible, thermally conductive vacuum skin being forced into thermally conductive contact with said heater block means at said contact position;

C. control means for selectively controlling the movement of said vacuum collar moving means; and, said vacuum table moving means.

D. means for selectively applying and releasing a vacuum to said vacuum table means.

3. A thermo-vacuum apparatus comprising:
A. a heater block assembly comprising:
(1) a temperature controlled, insulated heater block means;
(2) a vacuum collar means surrounding said heater block means;
(3) a flexible, thermally conductive vacuum skin means secured to said vacuum collar means;
(4) fluid actuated cylinder means connected to said vacuum collar means for moving said collar means and said flexible, thermally conductive vacuum skin means between an extended position and a retracted position with movement to said extended position being in response to the application of fluid at a pressure X to said fluid actuated cylinder means with said extended position locating the flexible, thermally conductive vacuum skin in spaced relation with respect to said heater block means;

B. a vacuum table assembly comprising:
(1) vacuum table means;
(2) a flat, porous plate means mounted on said vacuum table means so that the upper side of the porous plate means is parallel with the surface of the vacuum table means;
(3) vacuum sealing means located on said vacuum table means for establishing a vacuum sealing relation with the flexible, thermally conductive vacuum skin means of said heater block assembly;
(4) fluid actuated main cylinder means connected to said vacuum table means for moving said vacuum table means from a retracted position to an intermediate vacuum sealing position and then to a contact position and vice versa, said fluid actuated main cylinder means moving said vacuum table means to said intermediate sealing position in response to the application of a fluid at a pressure less than X to said fluid actuated main cylinder means at which position said sealing relation is established between the vacuum sealing means and the flexible, thermally conductive vacuum skin of the heater block assembly and, said fluid actuated main cylinder means moving said vacuum table means from said intermediate sealing position to said contact position in response to the application of a fluid at a pressure greater than X to said fluid actuated main cylinder means at which position said flexible, thermally conductive vacuum skin is forced into thermally conductive contact with said heater block means;

C. fluid pressure source means for applying fluid pressure at a pressure X to said heater block assembly fluid actuated cylinder means;

D. fluid pressure source means for sequentially applying fluid pressure at a pressure less than X and then at a pressure greater than X to said vacuum table assembly fluid actuated main cylinder means said fluid pressure source means including means for releasing the fluid pressure applied to said vacuum table assembly fluid actuated main cylinder means; and, E. means for selectively applying and releasing a vacuum to said vacuum table means.

4. The apparatus of claims 2 or 3 wherein said porous plate means is thermally non-conductive.

5. The apparatus of claim 3 wherein said thermally non-conductive porous plate means comprises a porous ceramic plate.

6. The apparatus of claims 2 or 3 wherein said vacuum sealing means comprises a compressible "O"-ring mounted on said vacuum table.

7. The apparatus of claims 2 or 3 wherein said vacuum sealing means comprises a compressible "O"-ring mounted on said vacuum table and wherein said "O"-ring is compressed at said intermediate sealing position to provide vacuum sealing between the vacuum table and the flexible, thermally conductive vacuum skin of the heater block assembly.

8. The apparatus of claims 2 or 3 wherein the heater block means, vacuum collar means and said flexible, thermally conductive vacuum skin means define a chamber and wherein said chamber is at least partially filled with a liquid heat transfer medium.

* * * * *